(12) United States Patent
Diab et al.

(10) Patent No.: US 7,738,387 B2
(45) Date of Patent: Jun. 15, 2010

(54) SYSTEM AND METHOD FOR DIAGNOSING A CABLING INFRASTRUCTURE USING A PHY

(75) Inventors: Wael William Diab, San Francisco, CA (US); Minshine Shih, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 600 days.

(21) Appl. No.: 11/654,012

(22) Filed: Jan. 17, 2007

(65) Prior Publication Data

US 2008/0170509 A1    Jul. 17, 2008

(51) Int. Cl.
*H04L 12/24* (2006.01)
*G01R 31/00* (2006.01)

(52) U.S. Cl. .................. 370/246; 370/250; 370/252; 324/500

(58) Field of Classification Search ......... 370/241–252; 324/500–537
See application file for complete search history.

(56) References Cited

U.S. PATENT DOCUMENTS

| | | | |
|---|---|---|---|
| 6,332,166 B1 * | 12/2001 | Cranford et al. ............ 709/250 |
| 6,977,507 B1 * | 12/2005 | Pannell et al. ............... 324/534 |
| 6,980,007 B1 | 12/2005 | Lo et al. |
| 7,005,861 B1 * | 2/2006 | Lo et al. ..................... 324/533 |
| 7,075,283 B1 | 7/2006 | Lo et al. |
| 7,173,431 B1 * | 2/2007 | Lo et al. ..................... 324/543 |
| 7,203,851 B1 | 4/2007 | Lo et al. |
| 7,340,363 B2 | 3/2008 | Tsai |
| 7,353,407 B2 * | 4/2008 | Diab et al. .................. 713/300 |
| 7,355,416 B1 | 4/2008 | Darshan |
| 7,375,532 B1 * | 5/2008 | Lo et al. ..................... 324/534 |
| 7,403,018 B1 * | 7/2008 | Lo et al. ..................... 324/533 |
| 2004/0251913 A1 | 12/2004 | Pharn et al. |
| 2005/0262364 A1 | 11/2005 | Diab et al. |
| 2006/0146842 A1 | 7/2006 | David et al. |
| 2007/0103829 A1 | 5/2007 | Darshan et al. |
| 2008/0129118 A1 | 6/2008 | Diab |

FOREIGN PATENT DOCUMENTS

WO  WO 2005117337 A1   12/2005
WO  WO 2006052360 A1   5/2006

* cited by examiner

*Primary Examiner*—Tri H Phan
(74) *Attorney, Agent, or Firm*—Duane S. Kobayashi

(57) ABSTRACT

A system and method for discovering a cable type using an automated, systematic process. A PHY can be designed to measure electrical characteristics (e.g., insertion loss, cross talk, length, etc.) of the cable to enable determination of the cable type. The determined cable type can be used in diagnosis of cabling infrastructure or in a dynamic configuration or operation process.

19 Claims, 6 Drawing Sheets

SYSTEM AND METHOD FOR DIAGNOSING A CABLING INFRASTRUCTURE USING A PHY

BACKGROUND

1. Field of the Invention

The present invention relates generally to network cabling systems and methods and, more particularly, to the diagnosing of a cabling infrastructure.

2. Introduction

The proliferation of computer networks has lead to the increased deployment of network cables. Initially, Category 3 cabling having "telephone grade" wire was deployed to support 10BASE-T Ethernet. This inexpensive twisted pair cabling supported runs up to a distance of 100 meters.

As network speeds increased, however, Category 3 cabling was determined to be incapable of supporting higher transmission rates. Category 5 cabling was then deployed to support technologies such as 100BASE-T Fast Ethernet. Today, Category 6 cabling has emerged as the next evolutionary step in network cabling for the support of Gigabit Ethernet and higher speeds.

Throughout this evolutionary process in transmission rates, network-cabling infrastructures have also been forced to evolve. This evolutionary process in the network-cabling infrastructure has often resulted in newer network cabling being added to the existing infrastructure. The resulting cabling infrastructure therefore resembles a patchwork of differing cable types. Only new installations are likely to have a cabling infrastructure of a single type of cable.

The typical result of an evolutionary process in cabling deployment is a network-cabling infrastructure that includes multiple generations of network cable types. For example, an office site may have a mix of Category 3, Category 5, and Category 6 network cables deployed throughout the office site. This results due to the expense of removing older network cables and the continuing utility of such older network cables for a subset of applications. In the end, the mix of network cables presents a significant challenge in ensuring that the right cable type is used for a given application. Typically, the determination of a cable type requires cable testing that is performed manually. This process is both time consuming and expensive. What is needed is a mechanism that enables an automated detection of the network cable type.

SUMMARY

A system and/or method for diagnosing a cabling infrastructure using a PHY, substantially as shown in and/or described in connection with at least one of the figures, as set forth more completely in the claims.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Various embodiments of the invention are discussed in detail below. While specific implementations are discussed, it should be understood that this is done for illustration purposes only. A person skilled in the relevant art will recognize that other components and configurations may be used without parting from the spirit and scope of the invention.

Determination of a cable type can have a significant impact on the utility of that cable for a given application. For example, a determination that a cable is of a Category 5 cable type would enable such a cable to be used for a 100BASE-T Fast Ethernet application. Analyzing a cable infrastructure with respect to a cable type is a key part of ensuring that the cable infrastructure is properly utilized. It is therefore a feature of the present invention that a cable infrastructure can be analyzed systematically in an automated fashion.

Figure 1:
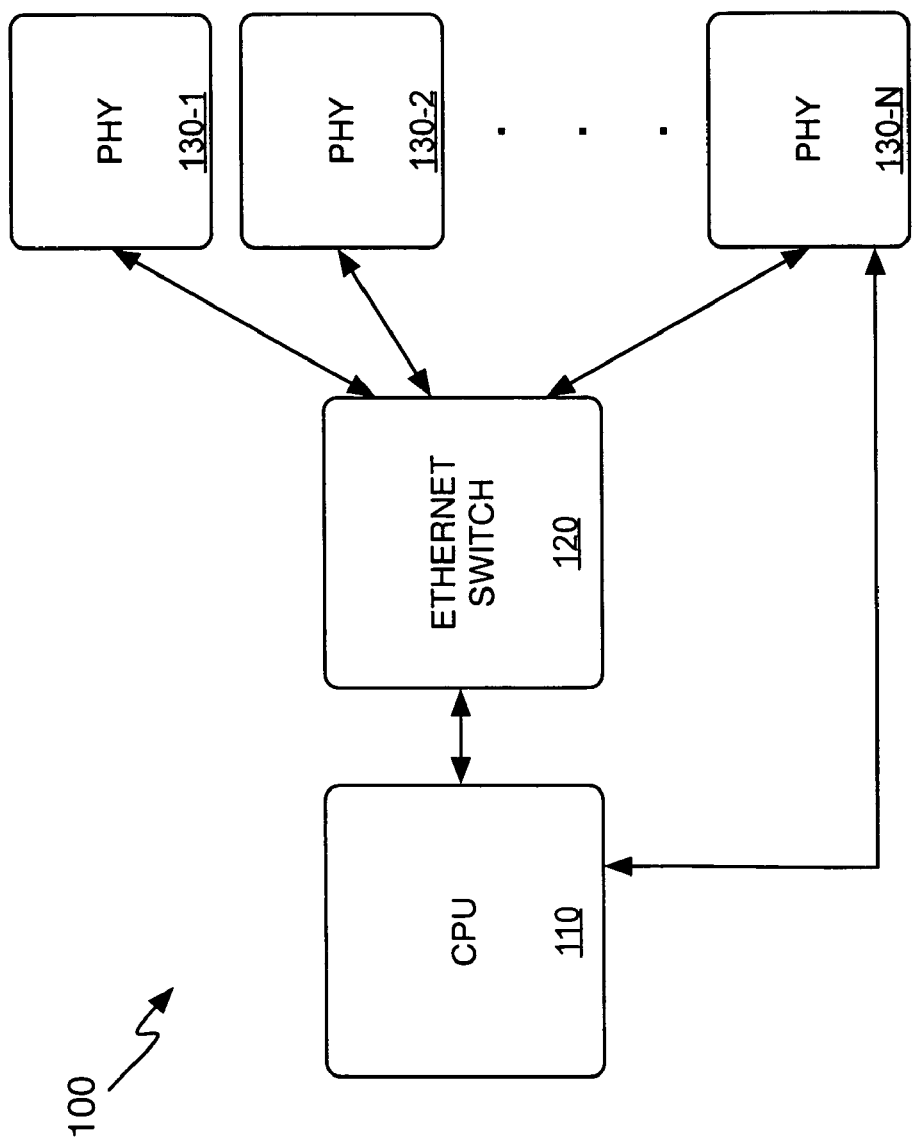
FIG. 1 illustrates an embodiment of a system that enables a determination of a cable type using cable characteristic information.

In accordance with the present invention, a cable infrastructure is analyzed using measurements of line characteristics that are taken by a PHY. FIG. 1 illustrates an embodiment of a system that can measure line characteristics in a network cable. As illustrated, measurement system 100 includes PHYs 130-1 to 130-N that are each connected to Ethernet switch 120. Each PHY is also connected to CPU 110, although only a single connection from CPU 110 to PHY 130-N is shown for simplicity.

In one embodiment, CPU 110 is incorporated along with Ethernet switch 120 and PHYs 110-1 to 110-N on a single chip. In another embodiment, Ethernet switch 120 and PHYs 110-1 to 110-N are incorporated on a single chip separate from CPU 110, wherein communication with CPU 110 is enabled via a serial interface.

Figure 2:
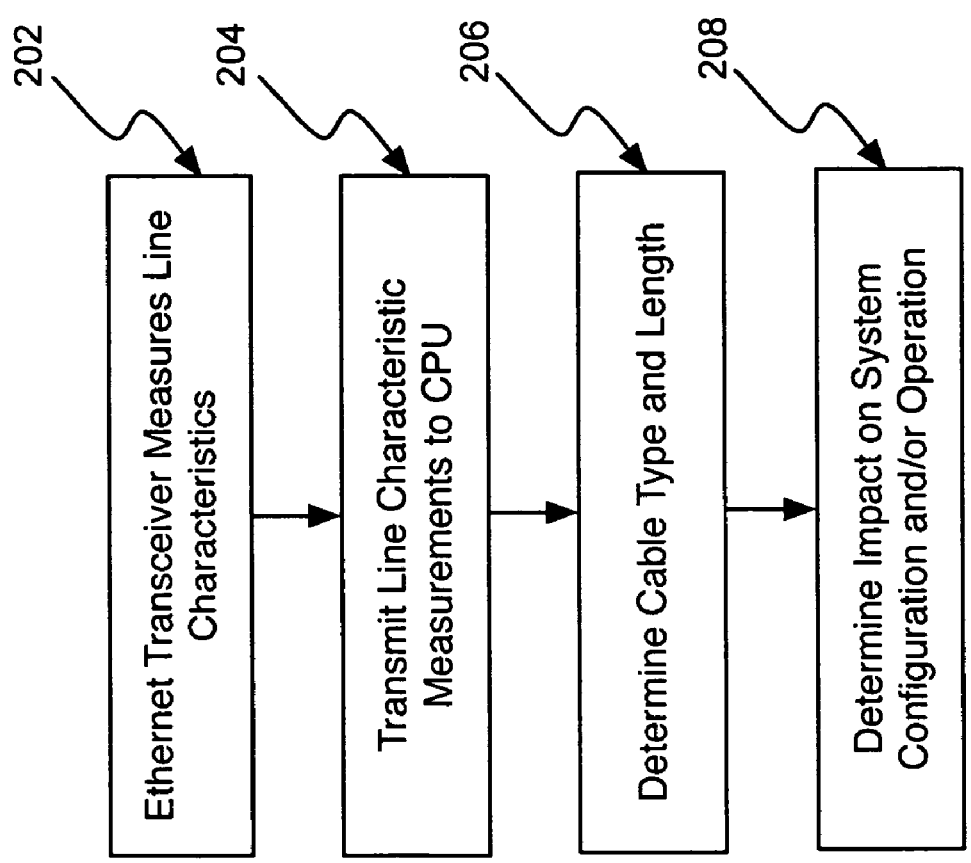
FIG. 2 illustrates a flowchart of a measurement process.

To illustrate the operation of measurement system 100 in implementing the principles of the present invention, reference is now made to the flowchart of FIG. 2. As illustrated, the flowchart of FIG. 2 begins at step 202 where a transceiver in PHY 130-N measures line characteristics of a cable coupled to PHY 130-N. In one embodiment, measurements that enable a determination of insertion loss, cross talk, and cable length are taken during an echo canceller convergence process performed by an echo canceller module under control of CPU 110. Line characteristic measurements taken by the transceiver are then transmitted to CPU 110 at step 204.

The line measurement data is used at step 206 to determine the cable type (e.g., Category 3, 5, 6, 7, etc.). In one embodiment, the cable length is also determined in addition to the cable type. In various embodiments, these determinations can be performed by CPU 110 or any other system element that is responsible for diagnosing or reporting the cable type. After the cable type (and possibly cable length) is determined, the system can then determine its impact on system configuration and/or operation at step 208. Examples of such an impact on system configuration and/or operation are described in greater detail below.

As noted above, one or more characteristics such as insertion loss, cross talk, length, etc. of the Ethernet cable are measured to determine a cable type. It should be noted that the measurement of the insertion loss, cross talk, and length of the Ethernet cable represents one example of the characteristics that can be used to estimate the cable type. Other measurements could also be used without departing from the principles of the present invention.

In general, different cable types conform to their own standards defining insertion loss over a range of frequencies. Electrical signals traveling down the cable attenuates differently with respect to the cable type. The insertion loss is a function of both frequency and cable length and is well defined for each cable type. To determine the cable type, the system can transmit one, multiple or continuous pulses with pre-determined frequency components into the cable. At the receiving end, the system can measure the magnitude attenuation and phase distortion, then combine this information with cable length to determine the cable type.

Figure 4:
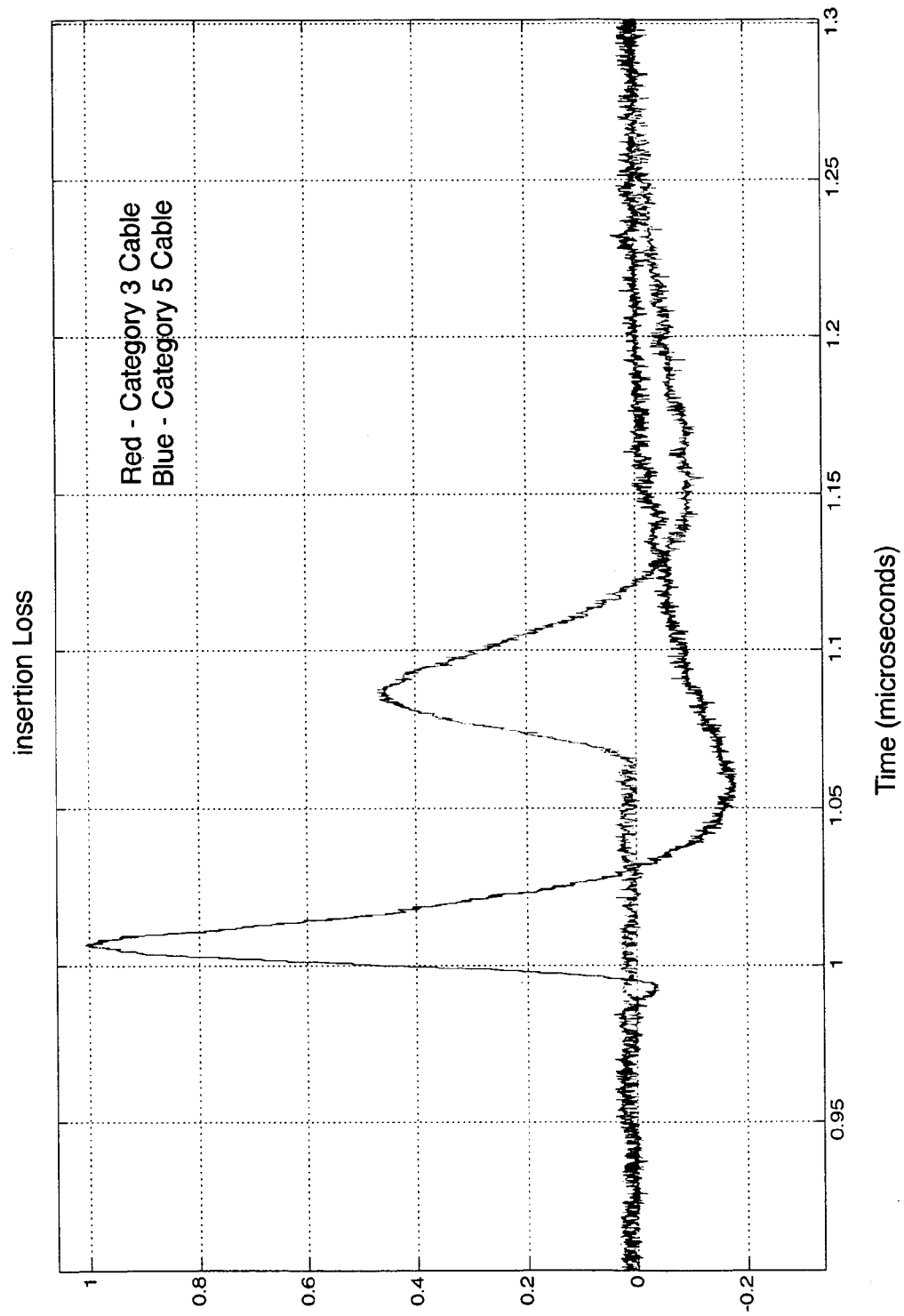
FIG. 4 illustrates an example of insertion loss measurements for Category 3 and Category 5 cable.

In one embodiment, the link partner can be powered off and the cable pair can be disconnected either on the line side of the transformer or on the opposite (transceiver) side of the transformer. In this case, almost all of the incidental pulse(s) are reflected back to the transmitting end with the same polarity, and the pulse(s) undergoes insertion loss corresponding to twice the cable length. FIG. 4 illustrates an example of insertion loss that can be measured for 100 m of Category 3 and Category 5 cable.

Figure 3:
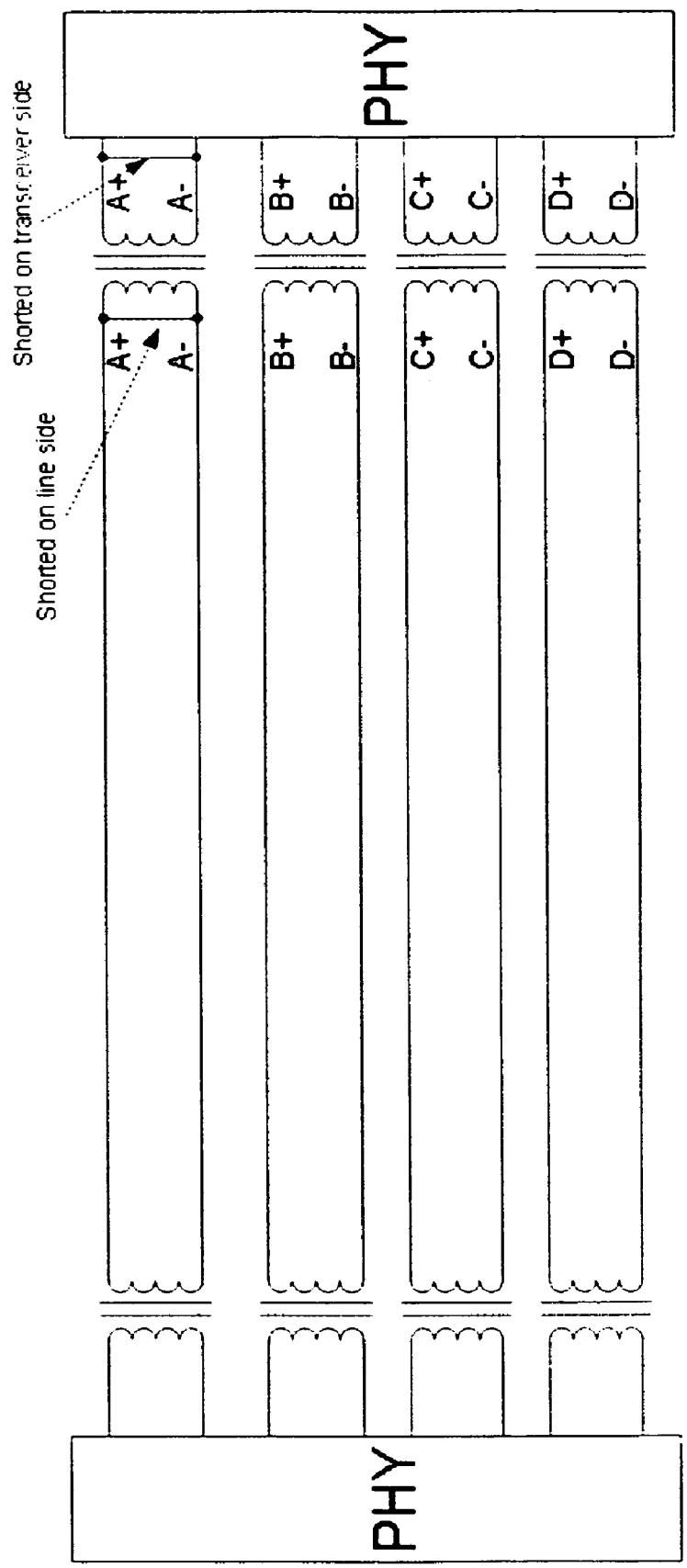
FIG. 3 illustrates a cable pair that can be shorted either on the line side or transceiver side of the transformer.

In another embodiment, the link partner can be powered off and the cable pair is shorted either on the line side of the transformer or on the opposite (transceiver) side of the transformer. This is illustrated in FIG. 3 where A+ is shorted to A−. In this case, almost all of the incidental pulse(s) are reflected back to the transmitting end with the opposite polarity, and the pulse(s) undergoes insertion loss corresponding to twice the cable length.

In another embodiment, the link partner can be powered off and two cable pairs are disconnected and shorted to the other pair to form a loop (e.g., A+ shorted to B+ and A− shorted to B−). This can happen on either the line side of the transformer or on the opposite (transceiver) side of the transformer. In this case, almost all of the incidental pulse(s) are routed back to the transmitting end in a different pair, and the pulse(s) undergoes insertion loss corresponding to twice the cable length.

In another embodiment, the link partner can be temporarily powered on to transmit pre-determined pulse(s). In this case, the pulse(s) undergoes insertion loss corresponding to the cable length.

Cross talk is similar to insertion loss in that different cable types conform to their own standards defining cross talk over a range of frequencies. Electrical signals traveling down the cable injects noise to adjacent pairs differently with respect to the cable type. The cross talk is a function of both frequency and cable length and is well defined for each cable type. To determine the cable type, the system can transmit one, multiple or continuous pulses with pre-determined frequency components into the cable. At the receiving end, the system can measure the magnitude attenuation and phase distortion, then combine this information with cable length to determine the cable type.

Figure 5:
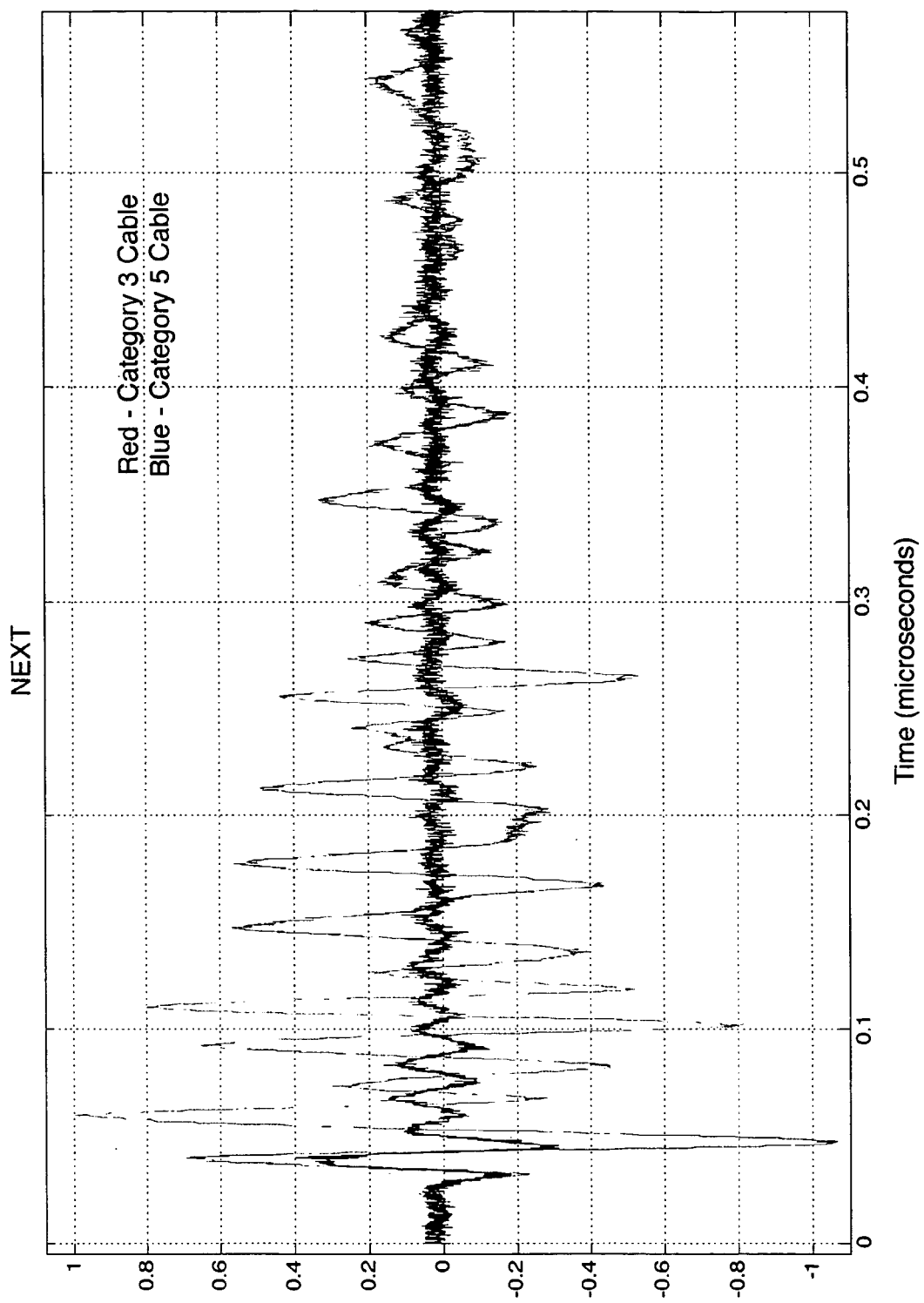
FIG. 5 illustrates an example of near end crosstalk measurements for Category 3 and Category 5 cable.

There are two types of cross talk: Near-end Cross Talk (NEXT) and Far-end Cross Talk (FEXT). For NEXT the noise injection comes from one or multiple local transmitters, while for FEXT the noise injection comes from one or more remote transmitters. Either NEXT or FEXT or a combination can be used to determine cable type. FIG. 5 illustrates an example of NEXT that can be measured for Category 3 and Category 5 cable.

In one embodiment, cable length can be determined directly using time domain reflectometry (TDR). In an alternative embodiment, cable length can be determined indirectly based on data generated in the measurement of insertion loss using a round trip of the injected signal. Here, the time interval between launching and receiving the pulse(s) is linearly proportional to the cable length. The cable length can then be computed by multiplying the propagation speed with the time interval, then divided by two to account for the round-trip delay.

The determination of the cable type based on measurements taken by the PHY can be used by the system in various ways. For example, the cable type can be used in a diagnostic capacity or as part of a dynamic configuration or operation process.

One application in which the principles of the present invention can be applied is in the general diagnostic of a cabling infrastructure. For example, it is often important that the cables in a wiring closet, or in a data center be properly identified prior to use. This is a time consuming task if manually performed as hundreds or perhaps thousands of network cables need to be identified. Manual identification is also prone to error if not performed and/or recorded in a systematic fashion.

The diagnostic tool of the present invention can be applied to a cabling infrastructure to determine the types of cables in a systematic fashion. For example, based on measurements such as insertion loss and cross talk, a diagnostic tool can classify each cable coupled to a chassis. A cable-type report can then be provided to alert a technician as to the nature of the cabling infrastructure. Cables not meeting a certain specification can then be "weeded out" with little effort. It should be noted that the diagnostic tool can also be used to identify whether all segments of a link are of a particular cable type.

Figure 6:
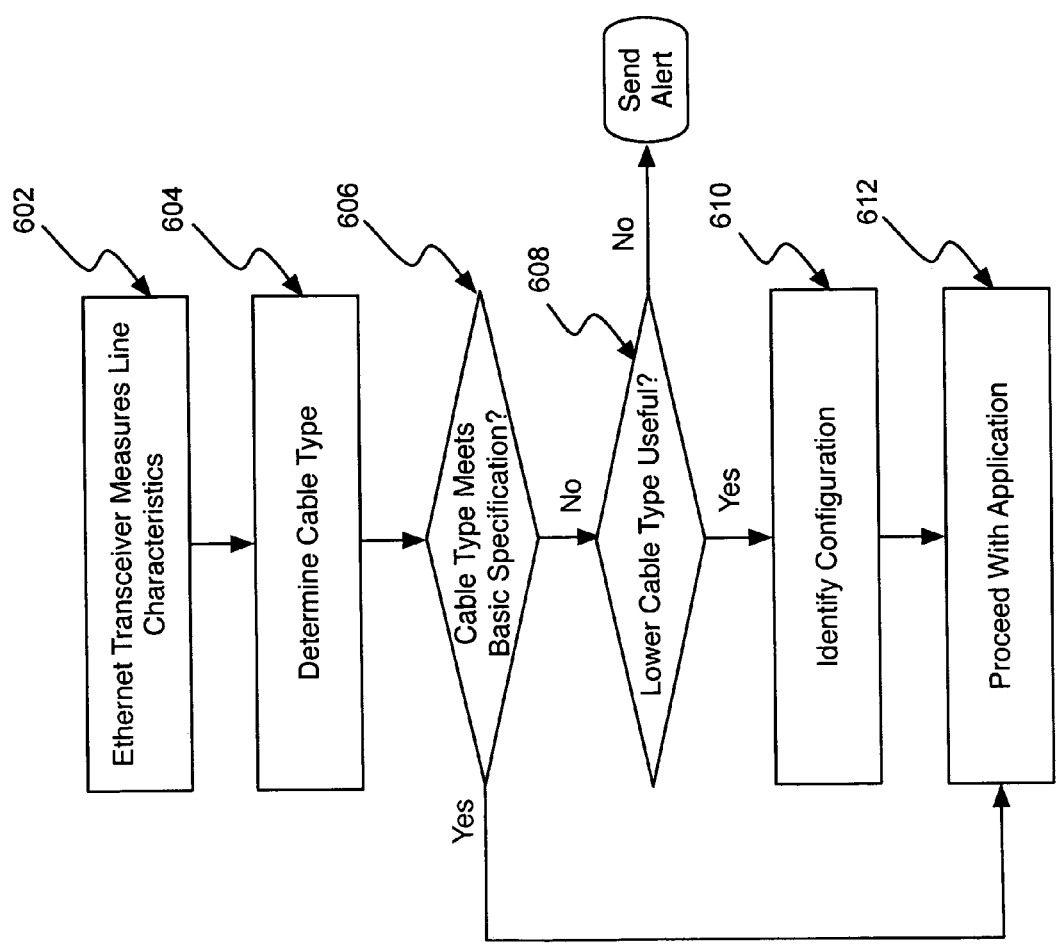
FIG. 6 illustrates a flowchart of a process for using cable type information.

More generally, it is a feature of the present invention that such a diagnostic tool can be integrated as part of a dynamic configuration or operation process. An example of such a dynamic configuration or operation process is illustrated in the flowchart of FIG. 6.

As illustrated the process begins at step 602, where an Ethernet transceiver measures line characteristics of a cable connected to a port. In one embodiment, the line characteristics would include insertion loss, cross talk, and length. Based on these line characteristic measurements, the cable type would then be identified at step 604. Next, at step 606, it is determined whether the identified cable type meets a basic specification.

For example, consider an application such as 10GBASE-T as defined by IEEE 802.3an. This specification includes a minimal requirement for cabling that states that Category 7 Ethernet cabling should be used. In this example, a determination that the cable type was Category 7 or better would indicate that the cable connected to the port is within the stated cable specifications. This Category 7 or better determination would then indicate, at step 612, that 10GBASE-T communication could proceed over the cable connected to that particular port.

In general, the determination at step 606 can be viewed as a threshold determination that dictates whether or not a given application can proceed over a previously unidentified cable. In other words, the type of cable need not be identified prior to coupling of that cable to a port. Rather, the measurement of line characteristics after coupling of the cable to the port would enable an identification of the type of cable. This determination could then be used in determining whether the port would be operational or not. If the cable meets the specifications then the port becomes operational. If the cable does not meet the specifications, then the port is disabled. In this case, an alert could also be generated to signal that the cable coupled to the port does not meet the specifications for the given application.

In one embodiment, the identification of the cable type can also be used in a configuration or operation of a port. In this case, a determination that the cable does not meet the basic specification would lead to a second determination at step 608 of whether a lower cable type would still be useful for that application. In general, this second determination is useful in those situations where the stated specifications of a given application are based on worst-case assumptions. For example, the stated specifications may be based on a worst-case assumption of the length of the cable. Here, a specification designed to support communication on a 100 meter cable may nonetheless work on a lesser quality cable at a shorter distance.

Recognizing this possibility, the determination at step 608 is designed to maximize the utility of the existing cable infrastructure. Instead of relying on overly broad characterizations of cable performance based solely on cable type, the principles of the present invention allow for an additional analysis to be performed to determine whether a given cable coupled to a port is workable in that particular application installation even though it does not meet a conservative specification.

As would be appreciated, the specific elements of the analysis performed at step 608 would be dependent on a given application. In a simple example, the analysis could be based on a simple determination of additional factors such as length to qualify a lesser quality cable. Here, a cable that did not meet the conservative specification of Category 7 cable, could nonetheless be qualified for use if the cable length was less than a predefined threshold (e.g., 50 meters).

Referring again to the flow chart of FIG. 6, if the determination at step 608 still indicates that the cable is not useful for a given application, then an alert is generated. This alert can generally be designed to signal a non-compliance condition on a given port. In one embodiment, the system can be designed to still attempt to use the cable on that port to see if the cable would support the given application.

If the determination at step 608 indicates that the cable not meeting the stated specification is nonetheless useful for a given application, then the appropriate configuration of that port is identified at step 610. As would be appreciated, the particular port configuration would be dependent on the particular application. In one example, the port configuration could simply include a recording of the cable type used on that port. In another example, the port configuration could also include an adjustment to circuitry or other parameters on that port to accommodate the identified cable type. After the proper configuration is identified, the application can then proceed on that port at step 612.

As has been described, various cable characteristics can be used to determine a cable type in an automated systematic manner using measurements taken by a PHY. This cable type information can be used to perform a diagnostic of the cable infrastructure or be integrated as part of a dynamic configuration or operation process.

These and other aspects of the present invention will become apparent to those skilled in the art by a review of the preceding detailed description. Although a number of salient features of the present invention have been described above, the invention is capable of other embodiments and of being practiced and carried out in various ways that would be apparent to one of ordinary skill in the art after reading the disclosed invention, therefore the above description should not be considered to be exclusive of these other embodiments. Also, it is to be understood that the phraseology and terminology employed herein are for the purposes of description and should not be regarded as limiting.

What is claimed is:

1. A cable diagnosis system for automatically determining an identity of a type of an Ethernet cable and a length of said Ethernet cable that is coupled to an Ethernet data transmission physical layer device on a port, comprising:
   a cable detection component in said Ethernet data transmission physical layer device that measures one or more electrical characteristics of said Ethernet cable coupled to said Ethernet data transmission physical layer device; and
   a controller that determines an identity of a type of said Ethernet cable based on said one or more measured electrical characteristics, said identity of said type of said Ethernet cable being unknown to said controller at a time of said determination, said controller being operative to generate a report of said determined Ethernet cable type for said port.

2. The cable diagnosis system of claim 1, wherein said cable detection component measures insertion loss of said Ethernet cable.

3. The cable diagnosis system of claim 1, wherein said cable detection component measures cross talk of said Ethernet cable.

4. The cable diagnosis system of claim 1, wherein said cable detection component measures a length of said Ethernet cable.

5. An Ethernet port configuration system, comprising:
   a cable detection component in an Ethernet data transmission physical layer device that measures an electrical characteristic of an Ethernet cable coupled to said Ethernet data transmission physical layer device; and
   a controller that determines a type of said Ethernet cable based on said measured electrical characteristics, said controller being operative to configure an aspect of operation of the Ethernet port based on said determined Ethernet cable type wherein said controller changes a parameter on the Ethernet port.

6. The Ethernet port configuration system of claim 5, wherein said cable detection component measures insertion loss of said Ethernet cable.

7. The Ethernet port configuration system of claim 5, wherein said cable detection component measures cross talk of said Ethernet cable.

8. The Ethernet port configuration system of claim 5, wherein said cable detection component measures a length of said Ethernet cable.

9. The Ethernet port configuration system of claim 5, wherein said controller determines whether the Ethernet port is operational or not.

10. The Ethernet port configuration system of claim 5, wherein said controller changes circuitry on the Ethernet port.

11. An Ethernet port method, comprising:
    upon initialization of an Ethernet port, measuring one or more electrical characteristics of an Ethernet cable coupled to the Ethernet port;
    identifying a length of said Ethernet cable coupled to the Ethernet port based on said one or more measured electrical characteristics;
    identifying performance characteristics of said Ethernet cable coupled to the Ethernet port based on said one or more measured electrical characteristics;

determining whether said identified length and said identified performance characteristics of said Ethernet cable coupled to the Ethernet port meet a minimum specification of a first mode of operation of an Ethernet data transmission physical layer device;

configuring said Ethernet data transmission physical layer device to operate in said first mode of operation when said determination indicates that said identified length and said identified performance characteristics of said Ethernet cable coupled to the Ethernet port meet said minimum specification of said first mode of operation; and configuring said Ethernet data transmission physical layer device to operate in a second mode of operation based when said determination indicates that said identified length and said identified performance characteristics of said Ethernet cable coupled to the Ethernet port do not meet said minimum specification of said first mode of operation.

12. The method of claim 11, wherein said determining comprises measuring insertion loss of said Ethernet cable.

13. The method of claim 11, wherein said determining comprises measuring cross talk of said Ethernet cable.

14. The method of claim 11, wherein said configuring comprises activating the Ethernet port.

15. The method of claim 11, wherein said configuring comprises adjusting a parameter of the Ethernet port.

16. The method of claim 11, wherein said configuring comprises adjusting circuitry on the Ethernet port.

17. The method of claim 11, further comprising generating a report of said determined type of cable.

18. The method of claim 11, wherein said configuring comprises configuring a link rate of said Ethernet physical layer device.

19. The method of claim 11, wherein said identifying performance characteristics comprises identifying a type of cabling.

* * * * *